(12) United States Patent
Yang et al.

(10) Patent No.: US 7,994,014 B2
(45) Date of Patent: Aug. 9, 2011

(54) SEMICONDUCTOR DEVICES HAVING FACETED SILICIDE CONTACTS, AND RELATED FABRICATION METHODS

(75) Inventors: Frank Bin Yang, Mahwah, NJ (US); Rohit Pal, Fishkill, NY (US); Michael J. Hargrove, Clinton Corners, NY (US)

(73) Assignee: Advanced Micro Devices, Inc., Austin, TX (US)

( * ) Notice: Subject to any disclaimer, the term of this patent is extended or adjusted under 35 U.S.C. 154(b) by 221 days.

(21) Appl. No.: 12/249,570

(22) Filed: Oct. 10, 2008

(65) Prior Publication Data
US 2010/0090289 A1    Apr. 15, 2010

(51) Int. Cl.
*H01L 21/336* (2006.01)
(52) U.S. Cl. .......... 438/300; 257/E21.619; 257/E21.634
(58) Field of Classification Search .......... 438/300–308; 257/E21.619, E21.634
See application file for complete search history.

(56) References Cited

U.S. PATENT DOCUMENTS

| | | | |
|---|---|---|---|
| 7,253,086 B2 * | 8/2007 | Hall | 438/595 |
| 2006/0115949 A1 * | 6/2006 | Zhang et al. | 438/300 |
| 2006/0286729 A1 * | 12/2006 | Kavalieros et al. | 438/183 |
| 2006/0289856 A1 | 12/2006 | Shimamune et al. | |
| 2008/0001260 A1 | 1/2008 | Zhu et al. | |
| 2008/0237634 A1 | 10/2008 | Dyer et al. | |

FOREIGN PATENT DOCUMENTS

EP    1 677 360 A2    7/2006

OTHER PUBLICATIONS

PCT International Search Report for PCT/US2009/059560 mailed Aug. 23, 2010.

* cited by examiner

*Primary Examiner* — Brook Kebede
(74) *Attorney, Agent, or Firm* — Ingrassia Fisher & Lorenz, P.C.

(57) ABSTRACT

The disclosed subject matter relates to semiconductor transistor devices and associated fabrication techniques that can be utilized to form silicide contacts having an increased effective size, relative to conventional silicide contacts. A semiconductor device fabricated in accordance with the processes disclosed herein includes a layer of semiconductor material and a gate structure overlying the layer of semiconductor material. A channel region is formed in the layer of semiconductor material, the channel region underlying the gate structure. The semiconductor device also includes source and drain regions in the layer of semiconductor material, wherein the channel region is located between the source and drain regions. Moreover, the semiconductor device includes facet-shaped silicide contact areas overlying the source and drain regions.

5 Claims, 14 Drawing Sheets

SEMICONDUCTOR DEVICES HAVING FACETED SILICIDE CONTACTS, AND RELATED FABRICATION METHODS

TECHNICAL FIELD

Embodiments of the subject matter described herein relate generally to semiconductor devices. More particularly, embodiments of the subject matter relate to the use of silicide source and drain contact regions that exhibit an increased silicide-to-silicon junction area.

BACKGROUND

The majority of present day integrated circuits (ICs) are implemented by using a plurality of interconnected field effect transistors (FETs), which may be realized as metal oxide semiconductor field effect transistors (MOSFETs or MOS transistors). A MOS transistor may be realized as a p-type device (i.e., a PMOS transistor) or an n-type device (i.e., an NMOS transistor). Moreover, a semiconductor device can include both PMOS and NMOS transistors, and such a device is commonly referred to as a complementary MOS or CMOS device. A MOS transistor includes a gate electrode as a control electrode that is formed over a semiconductor substrate, and spaced-apart source and drain regions formed within the semiconductor substrate and between which a current can flow. The source and drain regions are typically accessed via respective conductive contacts formed on the source and drain regions. Bias voltages applied to the gate electrode, the source contact, and the drain contact control the flow of current through a channel in the semiconductor substrate between the source and drain regions beneath the gate electrode. Conductive metal interconnects (plugs) formed in an insulating layer are typically used to deliver bias voltages to the gate, source, and drain contacts.

The desire for higher chip density has driven the development of fabrication processes capable of producing devices with smaller dimensions. As devices become smaller, the pitch between the gate stacks of neighboring transistors (e.g., for a CMOS implementation) also becomes smaller. In turn, the available area for silicide contact regions between neighboring gate stacks shrinks in a proportional manner. This available area may also be referred to as the silicide contact window or the silicide window. As the silicide contact window shrinks, the corresponding contact resistance increases due to the reduction in the silicide-to-silicon junction area. High contact resistance is undesirable, and it can be very problematic for modern process node technologies, e.g., 65 nm, 45 nm, 32 nm, and other small scale technologies.

The silicide contact window for 90 nm technology is about 180 nm, the silicide contact window for 65 nm technology is about 140 nm, the silicide contact window for 45 nm technology is about 90 nm, and the silicide contact window for 32 nm technology is only about 60 nm. When progressing from 90 nm technology to 32 nm technology, the size of the spacers (which are formed on the sidewalls of the gate stacks) can be reduced somewhat in an effort to maintain a tolerable silicide contact window. However, the minimum spacer size can be limited when using smaller scale technologies such as 32 nm technology. In such situations, the size of the silicide contact window cannot be preserved, which results in an undesirably high contact resistance. For example, the external resistance (which is influenced by the contact resistance) for a typical NMOS transistor fabricated using 90 nm technology can be relatively low (about 270 ohm-μm), while the external resistance for a typical NMOS transistor fabricated using 32 nm technology can be relatively high (about 430 ohm-μm). The higher external resistance can significantly degrade device performance.

BRIEF SUMMARY

The techniques and technologies described herein can be utilized to reduce the silicide contact resistance and, consequently, the external resistance of transistors. The reduction of the contact resistance can be particularly important for small scale process node technologies, for example, 32 nm technology.

The above and other aspects may be carried out by an embodiment of a method of fabricating a semiconductor device. The method involves, without limitation: providing a substrate having a layer of semiconductor material; creating a gate structure overlying the layer of semiconductor material; forming recesses in the layer of semiconductor material adjacent to the gate structure; and at least partially filling the recesses with a filler semiconductor material, to form facet-shaped semiconductor regions in the recesses.

Another method of fabricating a semiconductor device is also provided. This method begins by providing a substrate having a layer of semiconductor material. The method continues by creating a gate structure overlying the layer of semiconductor material, forming facet-shaped recesses in the layer of semiconductor material adjacent to the gate structure, and forming silicide contact areas on exposed surfaces of the facet-shaped recesses.

The above and other aspects may be found in an embodiment of a semiconductor device that includes a layer of semiconductor material, a gate structure overlying the layer of semiconductor material, a channel region in the layer of semiconductor material, the channel region underlying the gate structure, and source and drain regions in the layer of semiconductor material, the channel region being located between the source and drain regions. The semiconductor device also includes facet-shaped silicide contact areas overlying the source and drain regions.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
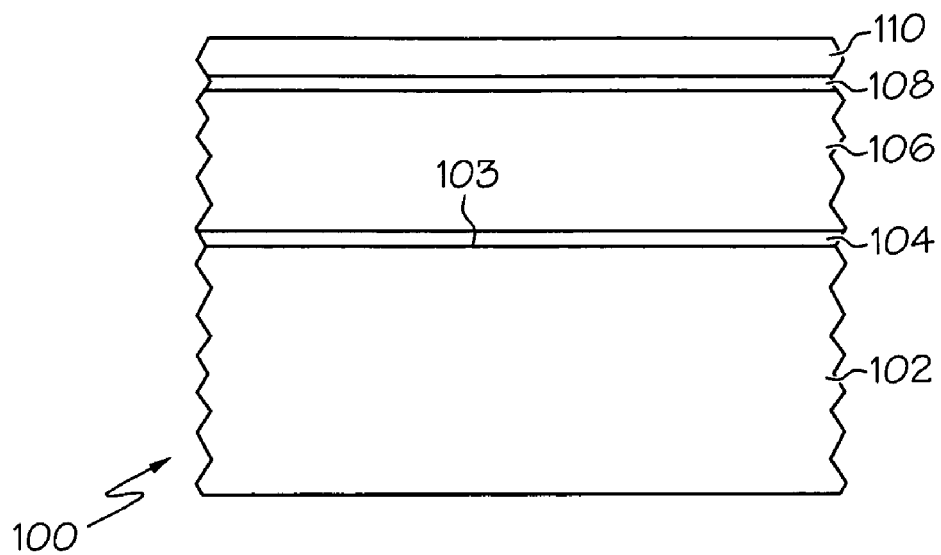
FIGS. 1-4 are cross sectional views that illustrate the formation of a gate structure of a semiconductor device.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

For the sake of brevity, conventional techniques related to semiconductor device fabrication may not be described in detail herein. Moreover, the various tasks and process steps described herein may be incorporated into a more comprehensive procedure or process having additional steps or functionality not described in detail herein. In particular, various steps in the manufacture of semiconductor based transistors are well known and so, in the interest of brevity, many conventional steps will only be mentioned briefly herein or will be omitted entirely without providing the well known process details.

The techniques and technologies described herein may be utilized to fabricate MOS transistor devices, including NMOS transistor devices, PMOS transistor devices, and CMOS transistor devices. Although the term "MOS device" properly refers to a device having a metal gate electrode and an oxide gate insulator, that term will be used throughout to refer to any semiconductor device that includes a conductive gate electrode (whether metal or other conductive material) that is positioned over a gate insulator (whether oxide or other insulator) which, in turn, is positioned over a semiconductor substrate.

The fabrication processes described herein result in increased silicide contact size and lower contact resistance, relative to conventional processes. In practice, the fabrication processes described herein can increase the size of silicide contacts by up to forty percent (compared to conventional processes) for the same gate pitch and the same spacer size. Consequently, the new approaches described below reduce the silicide contact resistance and, therefore, the external resistance of semiconductor transistor devices. This results in a significant improvement in drive current/speed.

FIGS. 1-4 are cross sectional views that illustrate the formation of a gate structure of a semiconductor device. The fabrication process may begin by providing or forming a substrate 100 having a layer of semiconductor material 102. Although any suitable semiconductor material may be employed, for this embodiment semiconductor material 102 is a silicon material, where the term "silicon material" is used herein to encompass the generally monocrystalline and relatively pure silicon materials typically used in the semiconductor industry, as well as silicon admixed with other elements such as germanium, carbon, and the like. Alternatively, semiconductor material 102 can be germanium, gallium arsenide, or the like. Depending upon the embodiment, semiconductor material 102 can be oriented such that its {100} plane or its {110} plane corresponds to its upper surface 103. Semiconductor material 102 can originally be either N-type or P-type silicon, but is typically P-type, and semiconductor material 102 is subsequently doped in an appropriate manner to form active regions. The active regions can be used for the source and drain regions of transistor devices. The layer of semiconductor material 102 may be realized in a silicon-on-insulator (SOI) substrate, where semiconductor material 102 is disposed on a layer of insulator material that, in turn, is supported by a carrier layer. Alternatively, the layer of semiconductor material 102 may be realized in a bulk silicon substrate rather than an SOI substrate.

FIG. 1 depicts substrate 100 after formation of a gate insulator layer 104 on semiconductor material 102, a layer of gate electrode material 106 on gate insulator layer 104, a pad oxide layer 108 on the layer of gate electrode material 106, and a pad nitride layer 110 on pad oxide layer 108. The resulting structure includes gate insulator layer 104 overlying semiconductor material 102, gate electrode material 106 overlying gate insulator layer 104, pad oxide layer 108 overlying gate electrode material 106, and pad nitride layer 110 overlying pad oxide layer 108.

Gate insulator layer 104 is typically formed from an oxide material, e.g., silicon oxide. Gate insulator layer 104 can be formed from a layer of thermally grown silicon dioxide or a deposited insulator such as a silicon oxide, silicon nitride, high-k gate dielectrics, such as $HfO_2$, $HfSiO_2$, HfSiON, or the like. Gate insulator layer 104 preferably has a thickness of about 1-10 nm, although the actual thickness can be determined based on the application of the transistor in the circuit being implemented. Deposited insulators can be deposited, for example, by chemical vapor deposition (CVD), low pressure chemical vapor deposition (LPCVD), plasma enhanced chemical vapor deposition (PECVD), or atomic layer deposition (ALD).

Gate electrode material 106 may be, without limitation: a metal material; a polycrystalline silicon material; a high dielectric constant metal material; or the like. In accordance with certain embodiments, gate electrode material 106 is deposited as undoped polycrystalline silicon and is subsequently impurity doped by ion implantation. As one example, the polycrystalline silicon can be deposited by LPCVD by the hydrogen reduction of silane. Thereafter, additional process steps can be used to arrive at the structure depicted in FIG. 1. For example, pad oxide layer 108 is grown to the desired thickness on gate electrode material 106, and pad nitride layer 110 is deposited over pad oxide layer 108 using an appropriate chemical vapor deposition (CVD) technique.

Figure 2:
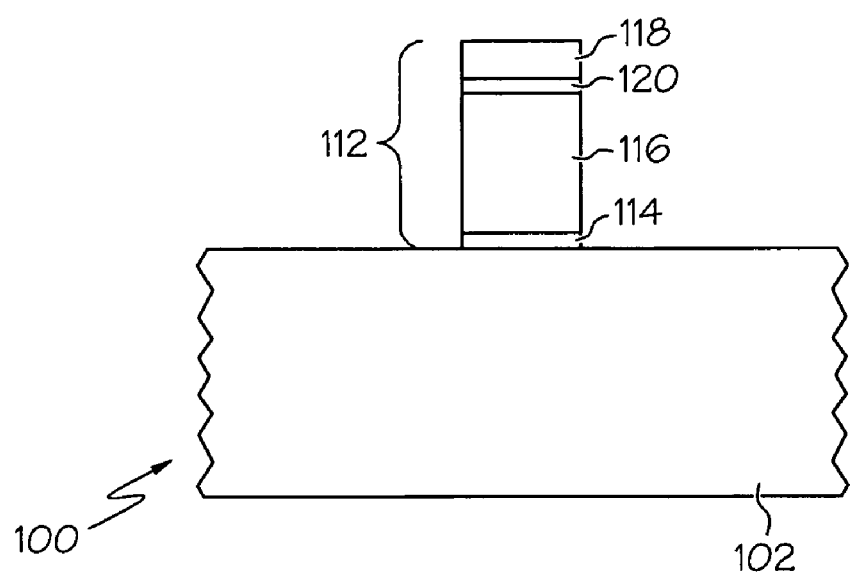

The substrate 100 as depicted in FIG. 1 is then photolithographically patterned and the underlying pad nitride layer 110, pad oxide layer 108, gate electrode material 106, and gate insulator layer 104 are etched to form a gate stack 112 on the semiconductor material 102 (FIG. 2). Gate stack 112 includes a gate insulator 114 formed from gate insulator layer 104, a gate electrode 116 formed from gate electrode material 106, and a nitride cap 118 formed from pad nitride layer 110. Gate stack 112 also includes pad oxide 120 between gate electrode 116 and nitride cap 118. The polycrystalline silicon can be etched in the desired pattern by, for example, reactive ion etching (RIE) using a chlorine or $HBr/O_2$ chemistry and the hard mask and gate insulating material can be etched, for example, by RIE in a $CHF_3$, $CF_4$, or $SF_6$ chemistry.

Figure 3:
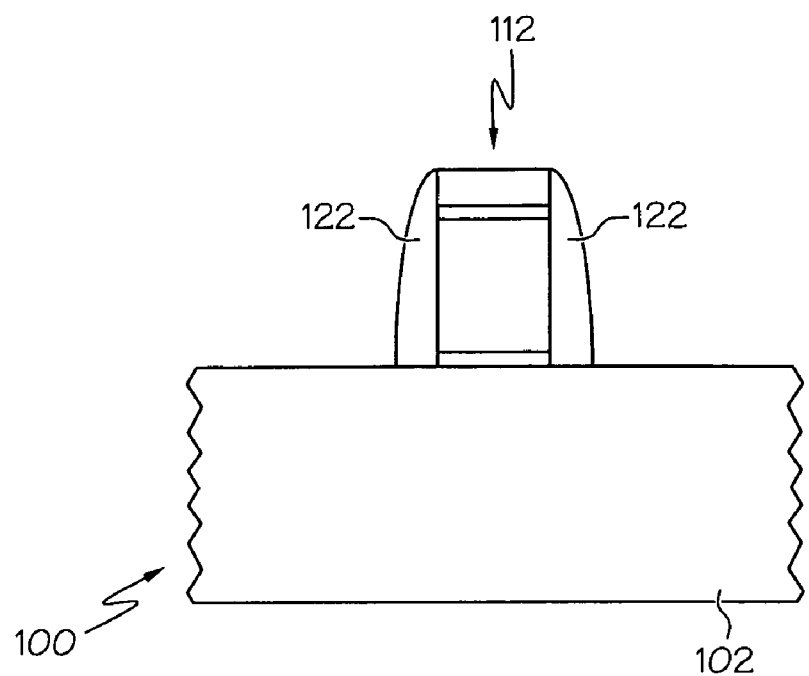

Although other fabrication steps or sub-processes may be performed after the step in the process depicted in FIG. 2, this example continues by forming spacers 122 adjacent to the sidewalls of gate stack 112 (FIG. 3). Spacers 122 are typically formed by conformally depositing a layer of dielectric material overlying gate stack 112 and the exposed surface of semiconductor material 102. The dielectric material is an appropriate insulator, such as silicon oxide and/or silicon nitride, preferably silicon nitride. The dielectric material can be deposited in a known manner by, for example, atomic layer deposition (ALD), CVD, LPCVD, semi-atmospheric chemical vapor deposition (SACVD), or PECVD. The dielectric material is deposited to a thickness so that, after anisotropic etching, spacers 122 are formed having a width that is appropriate for subsequent process steps. In typical implementations, the layer of dielectric material is deposited to a thickness of about 5-50 nm. The process continues, in accordance with an exemplary embodiment, with anisotropic etching of the layer of dielectric material to form spacers 122, as illustrated in FIG. 3. The layer of dielectric material can be etched by, for example, RIE using a suitable etching chemistry. As shown, the resulting spacers 122 are formed such that they are adjacent to the sidewalls of gate stack 112.

Figure 4:
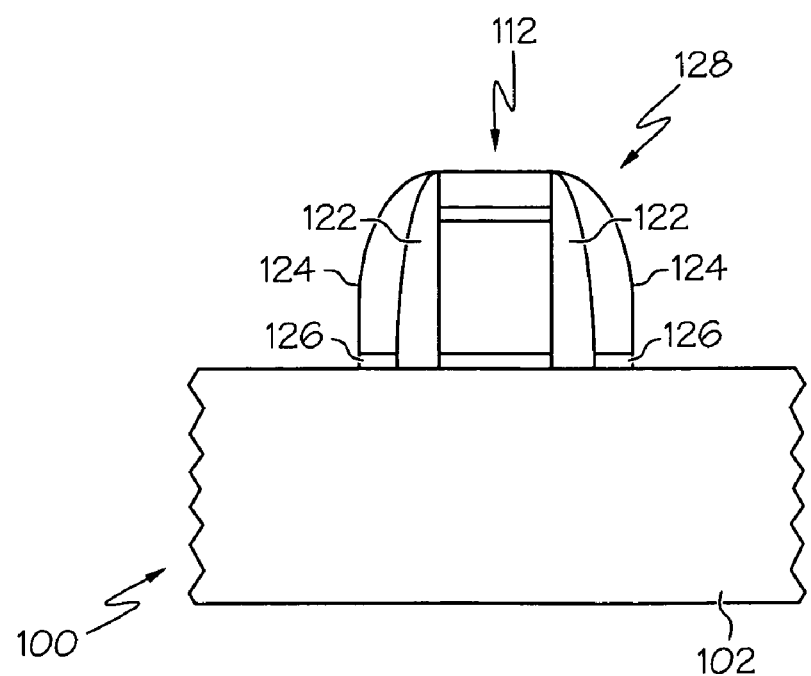

Although other fabrication steps or sub-processes may be performed after the step in the process depicted in FIG. 3, this example continues by forming disposable spacers 124 adjacent to the sidewalls of spacers 122 (FIG. 4). Although not separately shown, a layer of insulator material (preferably, the same material used to form spacers 122) is deposited on the exposed surface of semiconductor material 102; this insulator material serves as an etch stop for the formation of disposable spacers 124. After this layer of insulator material is formed, an appropriate spacer material is conformally deposited overlying gate stack 112, spacers 122, and the layer of insulator material. This spacer material is preferably an insulator material, such as silicon oxide and/or silicon nitride (typically, silicon nitride is used with polycrystalline silicon gate electrodes, and silicon oxide is used with high-k metal gate electrodes). The spacer material can be deposited in a known manner by, for example, ALD, CVD, LPCVD, SACVD, or PECVD. The spacer material is deposited to a thickness so that, after anisotropic etching, disposable spacers 124 are formed having a width that is appropriate for subsequent process steps. In typical implementations, the spacer material is deposited to a thickness of about 5-50 nm. The process continues, in accordance with an exemplary embodiment, with anisotropic etching of the layer of spacer material and the underlying layer of insulator material, as illustrated in FIG. 4. This step may involve, for example, RIE using a suitable etching chemistry. As shown, the resulting disposable spacers 124 are formed on the remaining insulator material 126. As described in more detail below, the sidewalls of disposable spacers 124 can be utilized to define the boundary of certain self-aligned features, such as recesses in semiconductor material 102.

Figure 5:
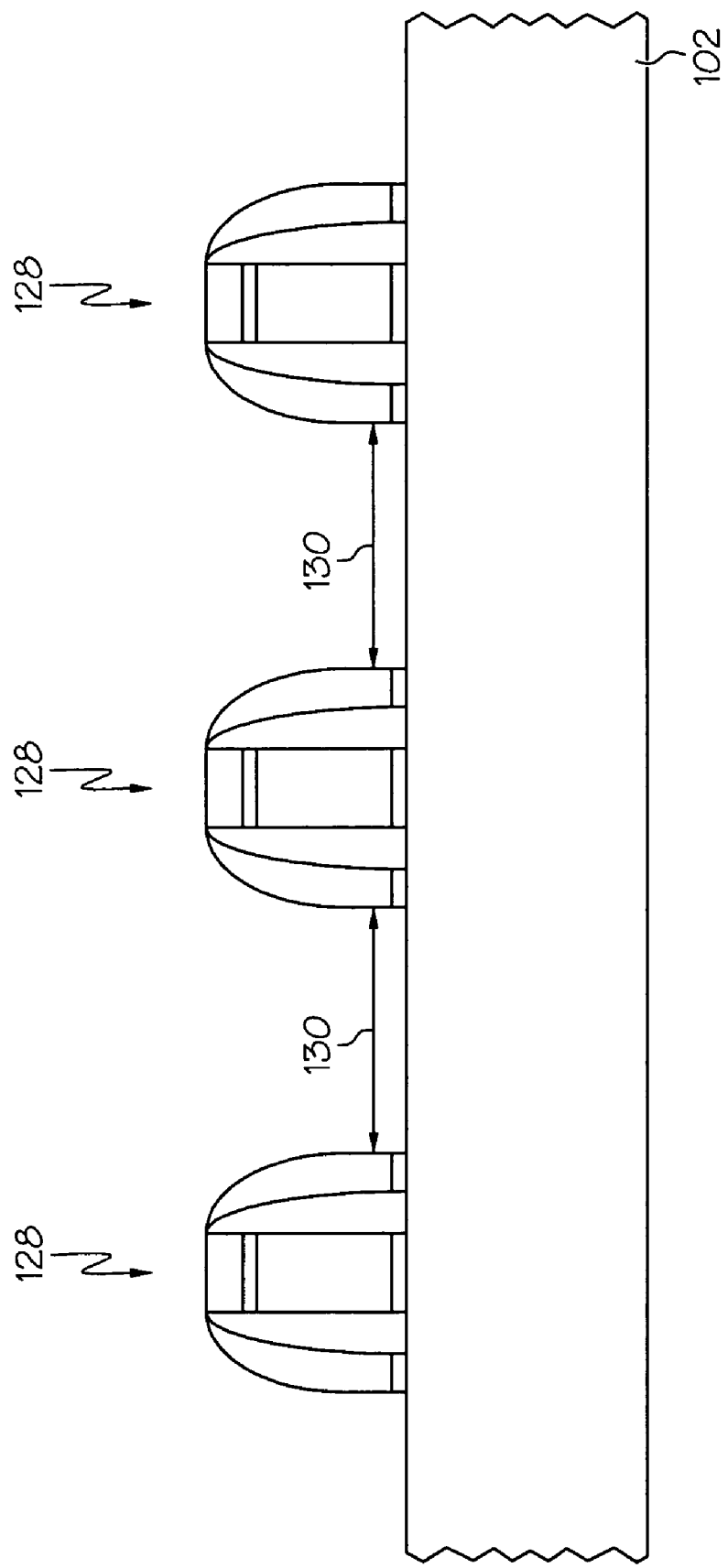
FIG. 5 is a cross sectional view of a semiconductor device structure having three adjacent gate structures.

The combination of gate stack 112, spacers 122, disposable spacers 124, and insulator material 126 may be referred to herein as a gate structure 128, as identified in FIG. 4. Notably, FIGS. 1-4 depict the creation of only one gate structure 128. In practice, however, a semiconductor device may include a plurality of gate structures 128 side by side and adjacent to each other. For example, FIG. 5 shows one embodiment that includes at least three gate structures 128 formed in accordance with the process steps described above. The arrows 130 in FIG. 5 represent the silicide contact window between neighboring gate structures 128. As explained previously, the silicide contact window shrinks in size with small scale process node technologies, thus reducing the potential silicide-to-silicon contact area and, in turn, increasing the contact resistance of the devices.

Figure 6:
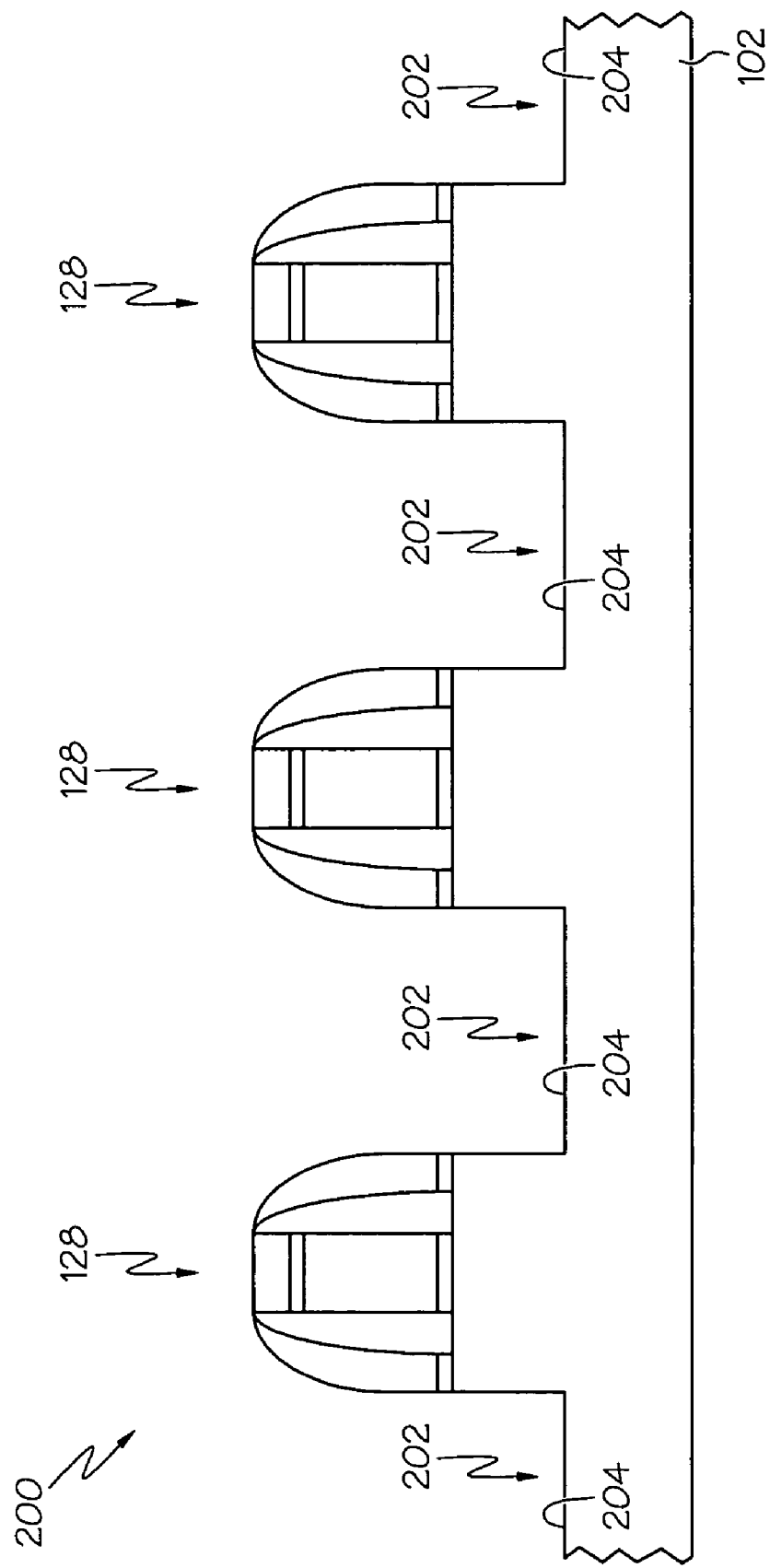
FIGS. 6-11 are cross sectional views that illustrate the fabrication of a semiconductor device in accordance with a first embodiment.

FIGS. 6-11 are cross sectional views that illustrate the fabrication of a semiconductor device 200 in accordance with a first embodiment. The following description assumes that a device structure as shown in FIG. 5 has already been formed and provided. In this regard, although other fabrication steps or sub-processes may be performed after formation of the device structure depicted in FIG. 5, this example continues with an etching step, which preferably employs an anisotropic etch technique. In accordance with this embodiment, gate structures 128 are used as a hard etch mask to form recesses 202 in the semiconductor material 102 adjacent to gate structures 128 (FIG. 6). Recesses 202 can be anisotropically etched using any suitable etchant or chemistry, such as chlorine or $HBr/O_2$ chemistry. This etching step is controlled to form recesses 202 having the desired depth for the given device structure. Notably, recesses 202 are self-aligned with disposable spacers 124. As used herein, self-aligned should be understood to mean that the inward facing sides of recesses 202 are naturally formed such that they are aligned with the outward facing sides of disposable spacers 124. This self-aligned characteristic is evident in FIG. 6, where it appears as though the vertical sidewalls of disposable spacers 124 continue downward to form the corresponding inward facing sidewalls of recesses 202.

This particular embodiment corresponds to the fabrication of PMOS transistor devices. Moreover, for this embodiment semiconductor material 102 has a crystal orientation such that the exposed recess surfaces 204 correspond to the {110} plane of semiconductor material 102.

Figure 7:
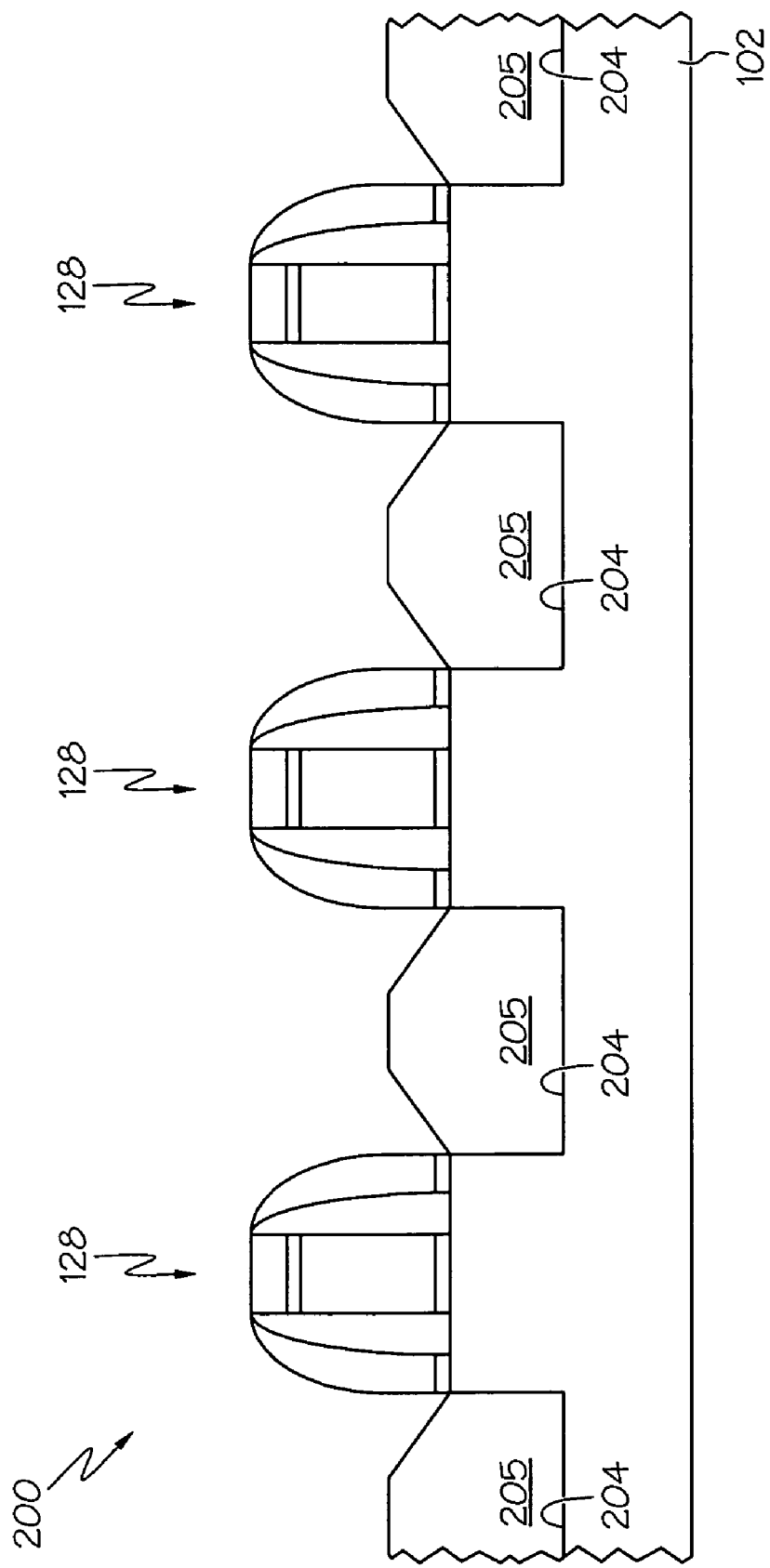
Figure 8:
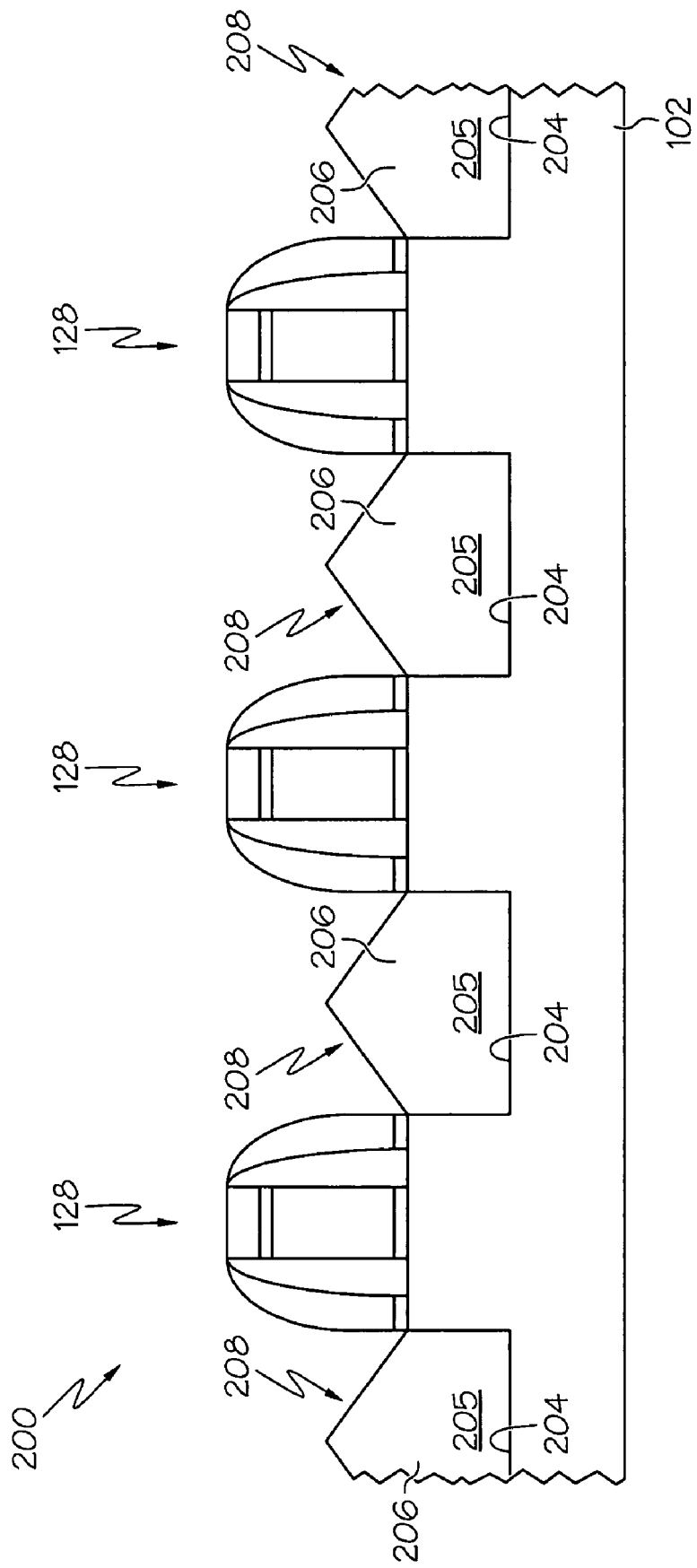
Figure 9:
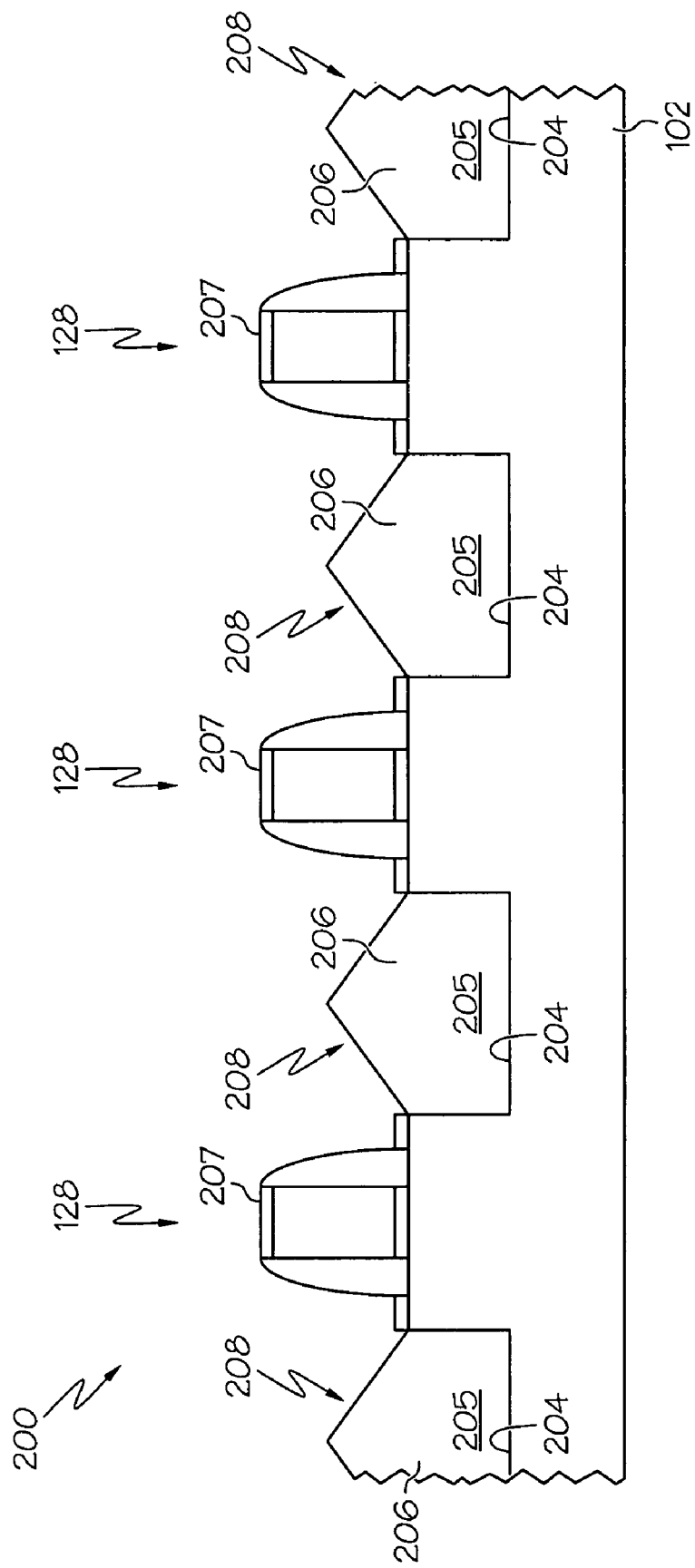
Figure 10:
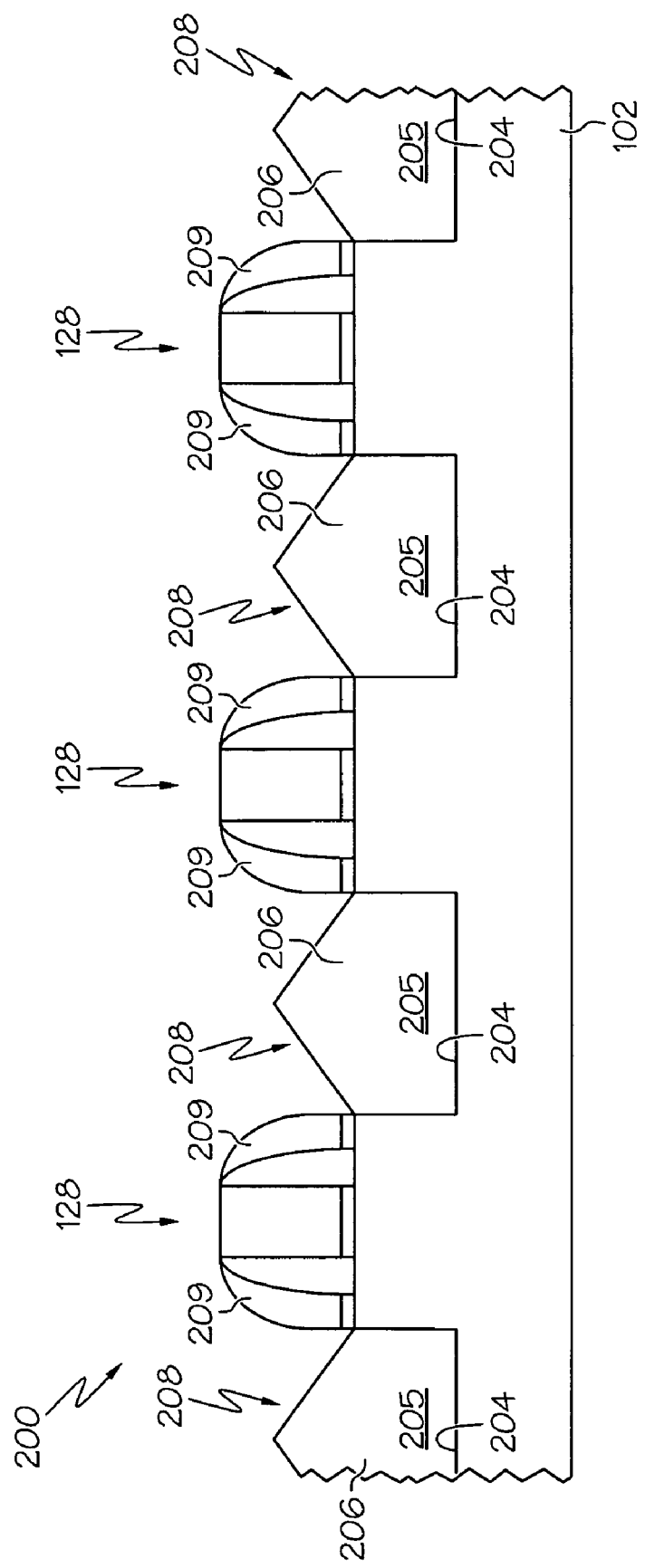

Although other fabrication steps or sub-processes may be performed after the formation of recesses 202, this example continues by at least partially filling recesses 202 with a filler semiconductor material 205, to form facet-shaped semiconductor regions 206 in recesses 202 (FIG. 7 and FIG. 8). During this step, filler semiconductor material 205 may be an undoped semiconductor material or an in situ doped semiconductor material. As used here, "in situ doped" means that a suitable dopant is introduced into a host material as that host material is grown. In situ doped silicon material can be utilized here such that the material need not be subjected to subsequent ion implantation for purposes of doping. In this embodiment, filler semiconductor material 205 is a stress-inducing semiconductor material that is formed by selectively epitaxially growing the material in recesses 202. For a PMOS transistor implementation as described here, filler semiconductor material 205 is typically silicon germanium (which may be in situ doped with boron). On the other hand, for an NMOS transistor implementation, filler semiconductor material 205 is typically silicon carbon (which may be in situ doped with phosphorus).

FIG. 7 depicts filler semiconductor material 205 during the formation of facet-shaped semiconductor regions 206, and FIG. 8 depicts filler semiconductor material 205 after complete formation of facet-shaped semiconductor regions 206. Notably, the step of epitaxially growing filler semiconductor material 205 is performed under certain growth conditions that promote formation of facet-shaped semiconductor regions 206 (rather than flat regions as traditionally formed using prior art fabrication processes). Referring to FIG. 8, for this embodiment each facet-shaped semiconductor region 206 includes a facet region 208 that points upward, relative to the substrate. In other words, each facet region 208 points toward the area defined between its two adjacent gate structures 128; this pointing direction opposes the respective recess surface 204. These upward pointing facet regions 208 result from growth conditions that promote a relatively high growth rate of filler semiconductor material 205 for its {110} plane and a relatively low growth rate of filler semiconductor material 205 for its {111} planes. As mentioned previously, the {110} plane of filler semiconductor material 205 corresponds to a horizontal plane (similar to the plane defined by recess surfaces 204) when viewed from the perspective of FIG. 8. The {111} planes of filler semiconductor material 205 are formed at approximately 45 degree angles relative to the {110} plane. The approximately 45 degree profile is apparent in the cross sectional view of FIG. 8, where the peak of each facet region 208 represents the intersection of two {111} planes.

The growth conditions under which facet-shaped semiconductor regions 206 are formed are controlled in a suitable manner to produce the desired growth characteristics. These growth conditions may include, without limitation, the growth temperature (which is the main critical growth parameter that determines the facet shapes). For example, upward pointing facet regions 208 can be obtained by epitaxially growing the filler semiconductor material 205 at a relatively high growth temperature (compared to conventional epitaxial growth techniques). In accordance with certain embodiments, the filler semiconductor material 205 is formed at a controlled growth temperature within the range of about 600-650 degrees Celsius. Notably, formation of these upward pointing facet regions 208 is self-limiting in that the filler semiconductor material 205 stops growing (or the growth rate significantly reduces) when the two {111} planes meet at the apexes of the facet regions 208.

Although other fabrication steps or sub-processes may be performed next, this example proceeds by removing disposable spacers 124 and nitride cap 118 using an appropriate wet etch process. This wet etch (typically, using hot phosphorus acid, which selectively etches only silicon nitride and leaves oxide and silicon substantially intact) results in the structure depicted in FIG. 9. As shown, the oxide 207 on the gate electrodes is now exposed. Thereafter, final spacers 209 are formed from an insulator material, such as silicon oxide and/or silicon nitride, preferably silicon nitride. In practice, the final spacers 209 can be formed using known material deposition, etching, and possibly other steps. In addition, the oxide 207 is removed to provide the structure shown in FIG. 10. The oxide 207 can be removed by an appropriate silicide pre-clean wet etch (e.g., buffered HF, or diluted HF) process.

Figure 11:
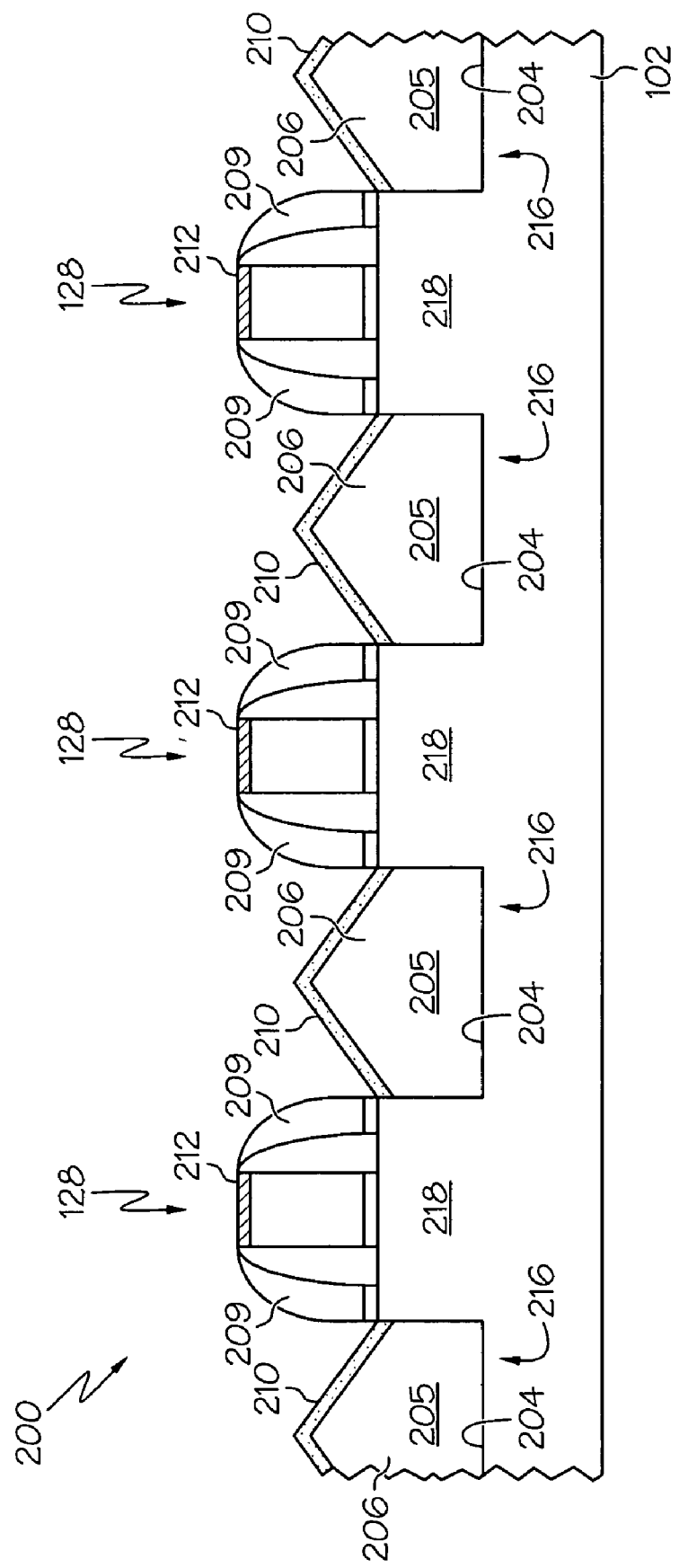

Although other fabrication steps or sub-processes may be performed at this time, this example continues by forming silicide contact areas 210 on facet-shaped semiconductor regions 206 (FIG. 11). In addition, silicide contact areas 212 may be formed on the polycrystalline silicon gate electrodes. In this regard, FIG. 11 depicts semiconductor device 200 after a number of known process steps have been performed. For the sake of brevity, these intermediate steps will not be described in detail.

After formation of final spacers 209, an appropriate silicidation process is performed to create metal silicide contact areas 210/212. For example, a layer of silicide-forming metal (not shown) is deposited onto the surfaces of facet-shaped semiconductor regions 206 and onto the surfaces of the gate electrodes. The silicide-forming metal can be deposited, for example, by sputtering to a thickness of about 5-50 nm and preferably to a thickness of about 10 nm. The device structure is then heated, for example by rapid thermal annealing, to form metal silicide contact areas 210/212. The silicide-forming metal can be, for example, cobalt, nickel, rhenium, ruthenium, or palladium, or alloys thereof. Any silicide-forming metal that is not in contact with exposed silicon does not react during heating and, therefore, does not form a silicide. This excess metal may be removed by wet etching or any suitable procedure.

Thereafter, any number of known process steps can be performed to complete the fabrication of the PMOS transistor device. Such additional steps may include, without limitation: ion implantation; forming an insulating layer over gate structures 128 and other features of semiconductor device 200; polishing that insulating layer; patterning and selectively etching that insulating layer to define vias (holes) above silicide contact areas 210/212; forming conductive plugs in the insulating layer by depositing metal, such as tungsten, in the via holes; and forming conductive metal traces/lines as needed to establish electrical contact with the conductive plugs (such conductive metal traces/lines are typically formed in the Metal-1 (M1) layer of semiconductor device 200).

Although the above description of semiconductor device 200 is directed to a PMOS implementation, a similar device structure can be obtained for an NMOS implementation. Most of the above description of the fabrication of semiconductor device 200 also applies to an NMOS device structure. However, for an NMOS implementation, the horizontal plane (similar to the plane defined by recess surfaces 204) corresponds to the {100} plane of semiconductor material 102. Another difference is that the filler semiconductor material for an NMOS implementation will typically be silicon carbon (rather than silicon germanium). Under certain controlled epitaxial growth conditions, upward pointing facet-shaped semiconductor regions can be formed. In such embodiments, the angled surfaces of the facet-shaped semiconductor regions correspond to the {111} planes of the filler semiconductor material.

Figure 12:
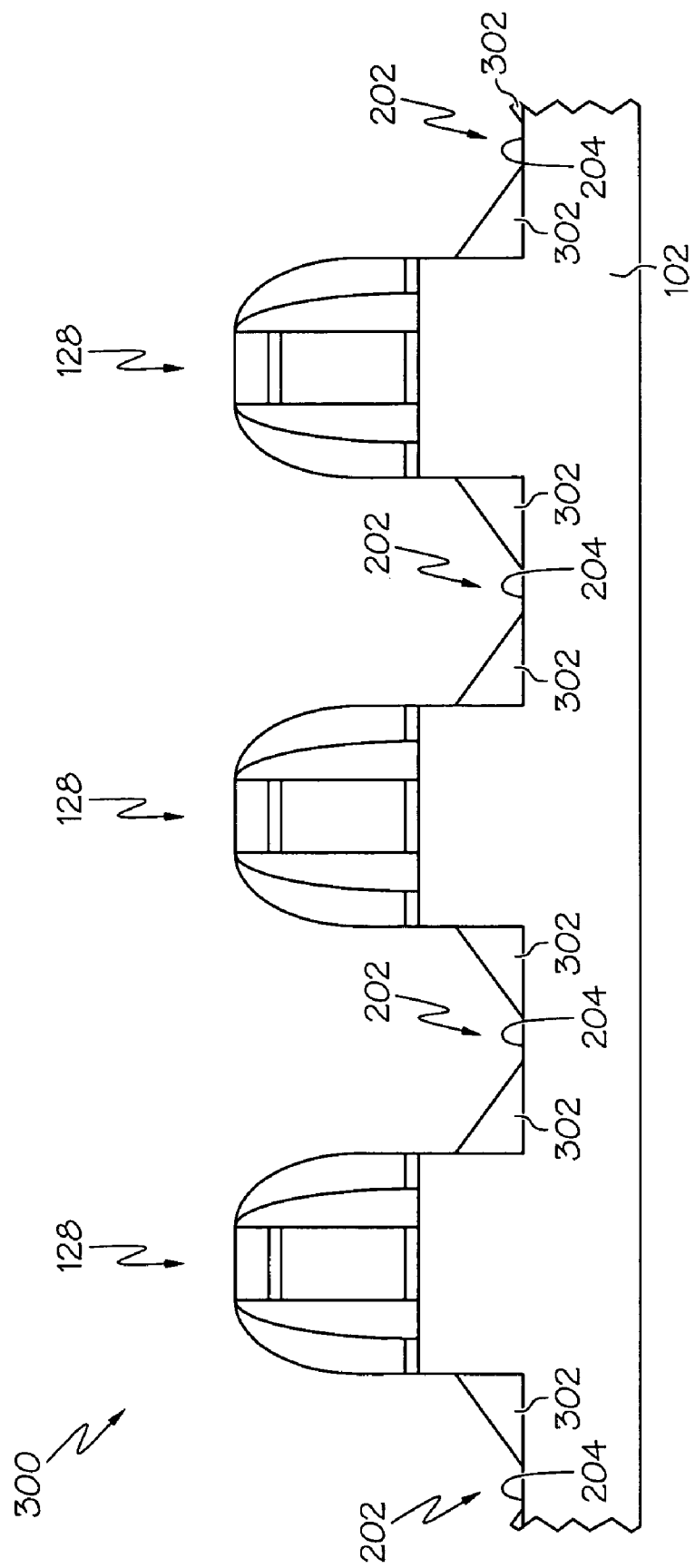
FIGS. 12-14 are cross sectional views that illustrate the fabrication of a semiconductor device in accordance with a second embodiment.
Figure 13:
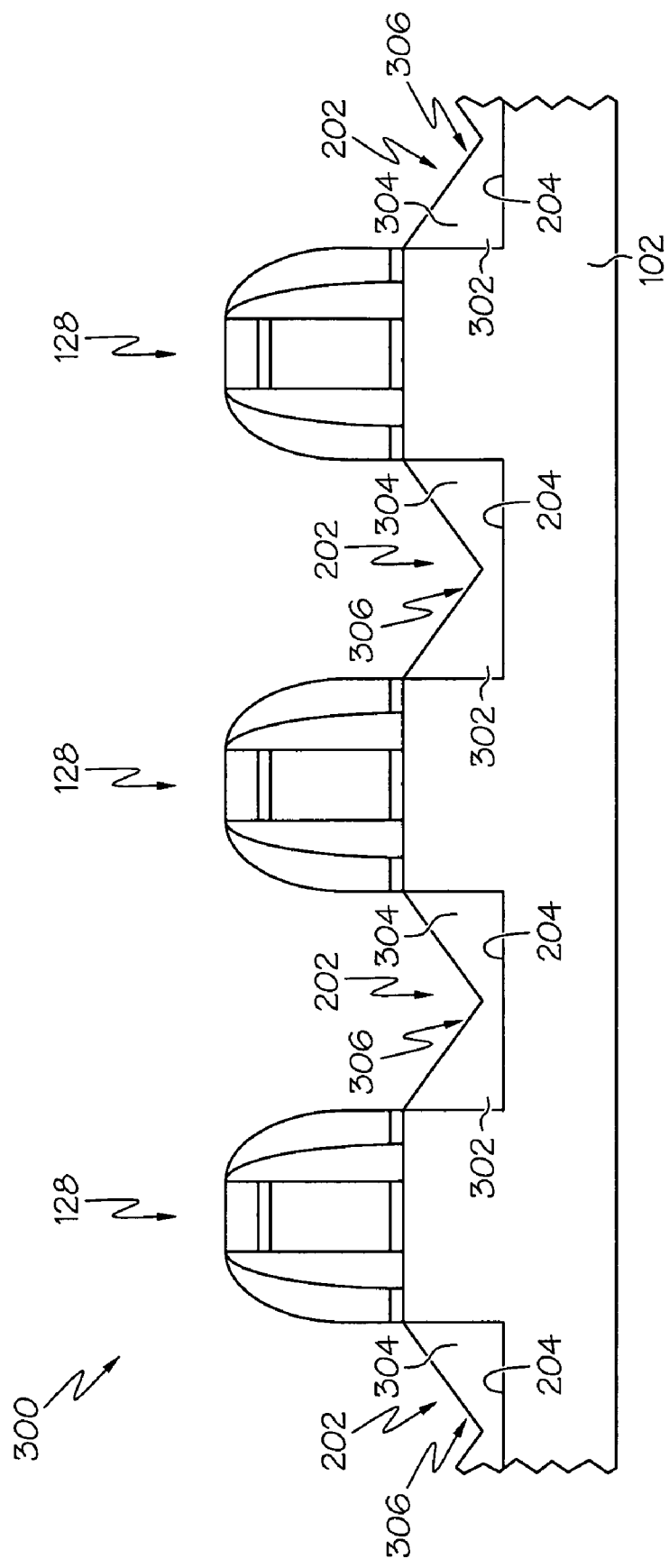
Figure 14:
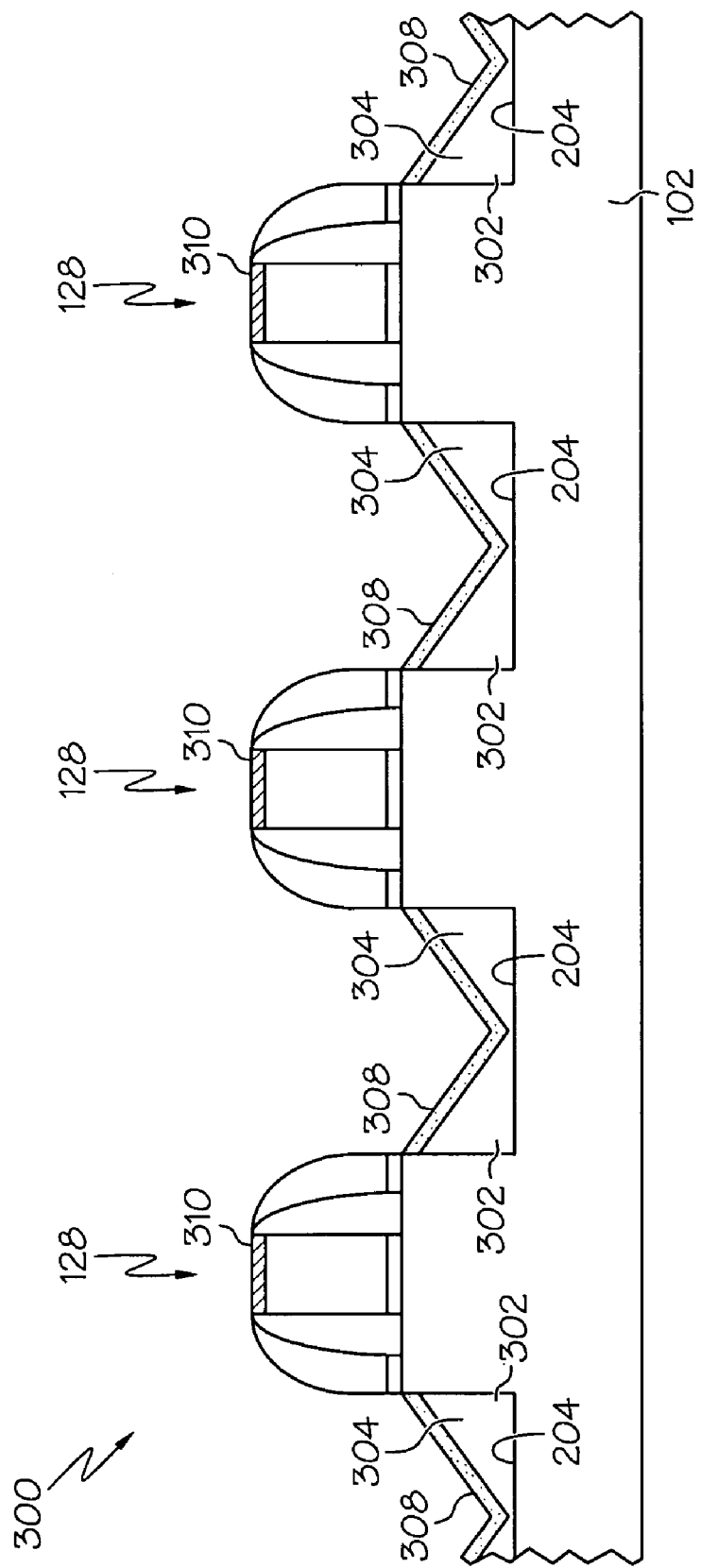

FIGS. 12-14 are cross sectional views that illustrate the fabrication of a semiconductor device 300 in accordance with a second embodiment. This embodiment relates to the fabrication of a PMOS transistor device. The following description assumes that a device structure as shown in FIG. 6 has already been formed and provided. In this regard, although other fabrication steps or sub-processes may be performed after formation of the device structure depicted in FIG. 6, this example continues by at least partially filling recesses 202 with a filler semiconductor material 302, to form facet-shaped semiconductor regions 304 in recesses 202 (FIG. 12 and FIG. 13). During this step, filler semiconductor material 302 may be an undoped semiconductor material or an in situ doped semiconductor material, as described above for semiconductor device 200. In this embodiment, filler semiconductor material 302 is a stress-inducing semiconductor material that is formed by selectively epitaxially growing the material in recesses 202, e.g., silicon germanium or silicon carbon (for an NMOS implementation).

FIG. 12 depicts filler semiconductor material 302 during the formation of facet-shaped semiconductor regions 304, and FIG. 13 depicts filler semiconductor material 302 after complete formation of facet-shaped semiconductor regions 304. Notably, the step of epitaxially growing filler semiconductor material 302 is performed under certain growth conditions that promote formation of downward pointing facet-shaped semiconductor regions 304 (rather than flat regions as traditionally formed using prior art fabrication processes). Referring to FIG. 13, for this embodiment each facet-shaped semiconductor region 304 includes a facet region 306 that points downward, relative to the substrate. In other words, each facet region 306 points toward the respective recess surface 204. These downward pointing facet regions 306 result from growth conditions that promote a relatively high growth rate of filler semiconductor material 302 for its {111} planes and a relatively low growth rate of filler semiconductor material 302 for its {110} plane. The {111} planes of filler semiconductor material 302 are formed at approximately 45 degree angles relative to the {110} plane. The approximately 45 degree profile is apparent in the cross sectional view of FIG. 13, where the point of each facet region 306 represents the intersection of two {111} planes.

The growth conditions under which facet-shaped semiconductor regions 304 are formed are controlled in a suitable manner to produce the desired growth characteristics. In this case, downward pointing facet regions 306 can be obtained by epitaxially growing the filler semiconductor material 302 at a relatively low growth temperature (compared to conventional epitaxial growth techniques). In accordance with certain embodiments, the filler semiconductor material 302 is formed at a controlled growth temperature within the range of about 500-580 degrees Celsius. Notably, formation of these downward pointing facet regions 306 is self-limiting in that the filler semiconductor material 302 stops growing (or the growth rate significantly reduces) when the two {111} planes meet to form a V-shape.

Although other fabrication steps or sub-processes may be performed at this time, this example continues by forming silicide contact areas 308 on facet-shaped semiconductor regions 304 (FIG. 14). In addition, silicide contact areas 310 may be formed on the polycrystalline silicon gate electrodes. In this regard, FIG. 14 depicts semiconductor device 300 after completion of process steps related to silicidation (as described above for semiconductor device 200). Thereafter, any number of known process steps can be performed to complete the fabrication of the PMOS transistor device. A number of such process steps were mentioned above in the description of semiconductor device 200.

In practice, upward-pointing silicide contacts (FIG. 11) may be preferred over downward-pointing silicide contacts (FIG. 14). This is due to the fact that upward-pointing silicide contacts offer both lower contact resistance and higher stress applied to the channel region.

Figure 15:
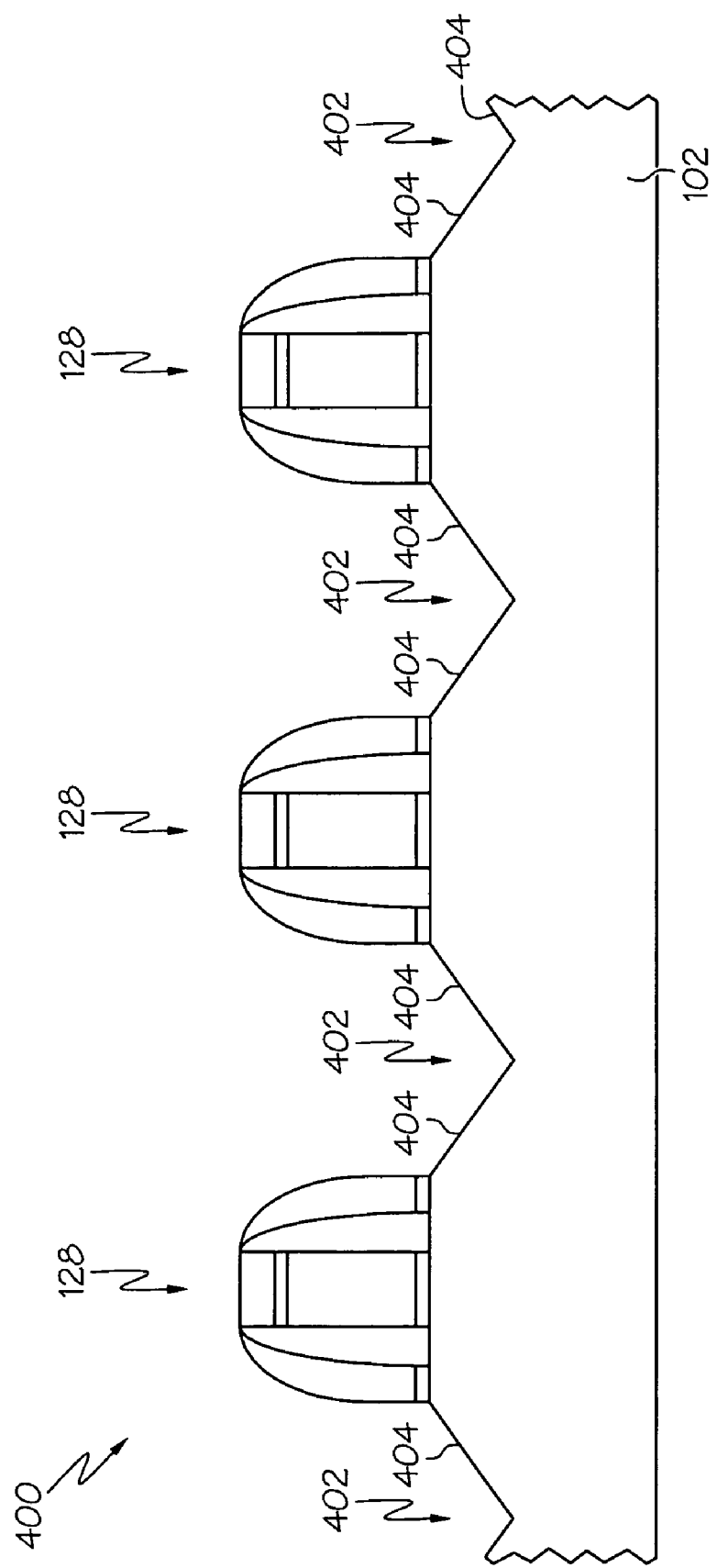
FIGS. 15 and 16 are cross sectional views that illustrate the fabrication of a semiconductor device in accordance with a third embodiment.
Figure 16:
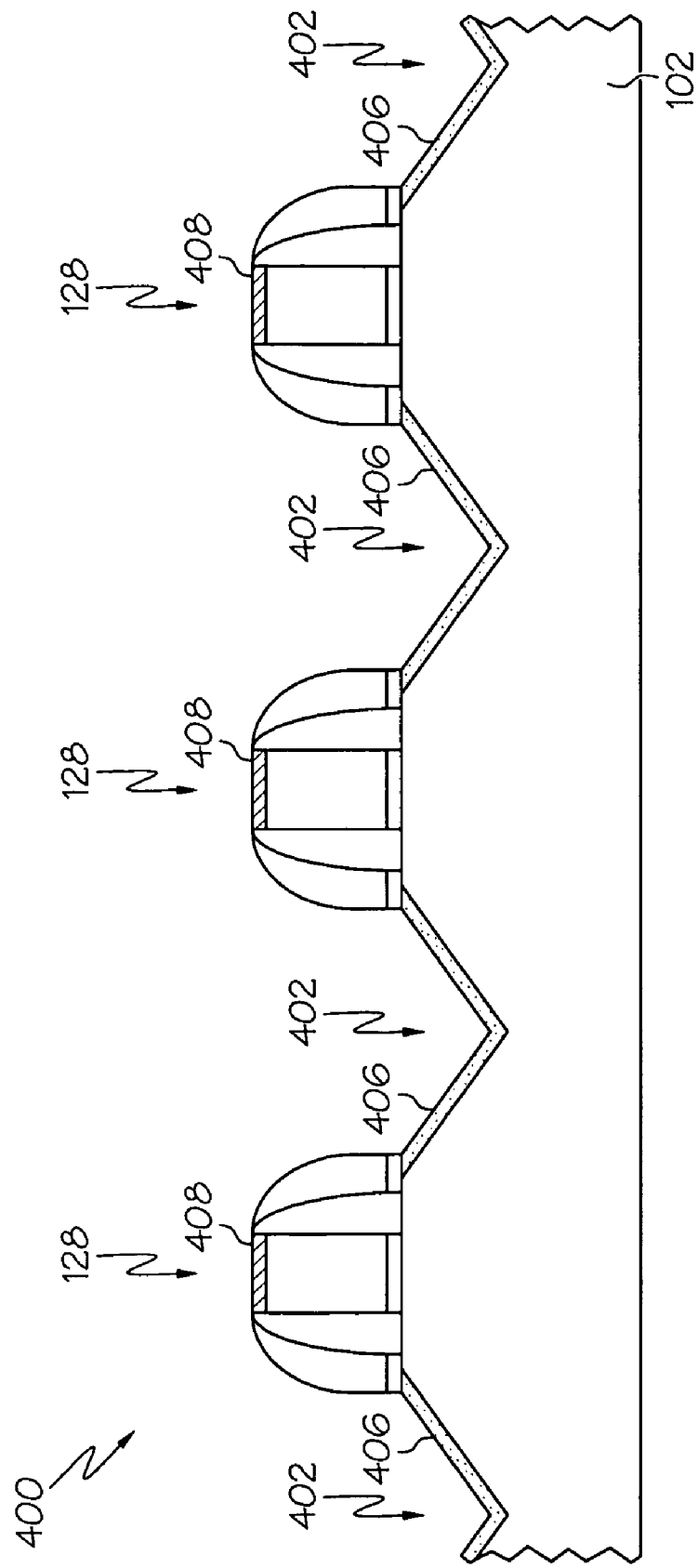

FIGS. 15 and 16 are cross sectional views that illustrate the fabrication of a semiconductor device 400 in accordance with a third embodiment. This embodiment is applicable to PMOS and NMOS transistor devices, where semiconductor material 102 is oriented on its {100} plane or its {110} plane. The following description assumes that a device structure as shown in FIG. 5 has already been formed and provided. In this regard, although other fabrication steps or sub-processes may be performed after formation of the device structure depicted in FIG. 5, this example continues with an etching step, which preferably employs a suitable wet etch chemistry that attacks the different crystal planes at different rates. In accordance with this embodiment, gate structures 128 are used as a hard etch mask to form facet-shaped recesses 402 in the semiconductor material 102 adjacent to gate structures 128 (FIG. 15).

Facet-shaped recesses 402 can be etched using any suitable etchant or chemistry that etches the {111} planes of semiconductor material 102 at a relatively low rate, and the {100} and {110} planes of semiconductor material 102 at a relatively high rate. In certain exemplary embodiments, facet-shaped recesses 402 are formed by etching semiconductor material 102 with a potassium hydroxide (KOH) based etchant. Alternatively (or additionally), a tetramethylammonium hydroxide (TMAH) based etchant can be used for this step. These etchants attack the {111} surface of silicon at a significantly lower rate than the other surface planes, including the {100} and {110} planes. In this regard, KOH based etchants are capable of etching most silicon surface planes at rates up to about 100 times the etch rate of the silicon surface planes {111}. Similarly, TMAH based etchants are capable of etching most silicon surface planes at rates up to about 37 times the etch rate of the silicon surface planes {111}.

Referring again to FIG. 15, the exposed surfaces 404 of facet-shaped recesses 402 correspond to the {111} planes. Consequently, due to the different planar etch rates, downward pointing facet-shaped recesses 402 are formed during the etching step. The resulting exposed surfaces 404 are angled at approximately 45 degrees relative to the horizontal plane as viewed from the perspective of FIG. 15. Notably, KOH and TMAH based etch solutions are selective to silicon nitride and silicon oxide. Accordingly, facet-shaped recesses 402 can be easily formed in a manner that is compatible with existing NMOS and PMOS process steps utilized to form source/drain regions.

Although other fabrication steps or sub-processes may be performed at this time, this example continues by forming silicide contact areas 406 on the exposed surfaces 404 of facet-shaped recesses 402 (FIG. 16). In addition, silicide contact areas 408 may be formed on the polycrystalline silicon gate electrodes. In this regard, FIG. 16 depicts semiconductor device 400 after completion of process steps related to silicidation (as described above for semiconductor device 200). Thereafter, any number of known process steps can be performed to complete the fabrication of semiconductor device 400. A number of such process steps were mentioned above in the context of semiconductor device 200.

Referring back to FIG. 11, the completed semiconductor device 200 generally includes, without limitation: layer of semiconductor material 102, gate structures 128 overlying the layer of semiconductor material 102, source and drain regions 216 in the layer of semiconductor material, and channel regions 218 in the layer of semiconductor material 102. Each channel region 218 resides under a respective gate structure 128, and each channel region 218 is located between respective source and drain regions 216, as understood by those familiar with MOS transistor fabrication, design, and operation. The filler semiconductor material 205 may correspond to the source and drain regions 216, and the facet-shaped silicide contact areas 210 overlying the source and drain regions 216 allow suitable voltages to be applied to the source and drain regions 216 during operation of the device. As explained above, the facet-shaped semiconductor regions 206 are defined in part by the {111} planes of semiconductor material 102.

Referring to FIG. 14 and FIG. 16, the completed semiconductor devices 300/400 will also include source, drain, and channel regions as described in the preceding paragraph. Thus, the various embodiments described herein utilize facet-shaped silicide contacts, which may be pointed upward or downward. Moreover, the facet-shaped silicide contacts can be formed on semiconductor material 102 itself or on filler semiconductor material located in recesses formed in semiconductor material 102.

Compared to conventional silicide contacts, which are designed to be flat within the contact window, silicide contacts that are angled at approximately 45 degrees increase the effective contact size (the silicide-to-silicon contact area) by about forty percent. This general trait is shared by the different embodiments described herein. For semiconductor device 400, however, the facet angles might vary depending upon the particular etching step and etchant chemistry. Thus, the increase in effective contact size may be more or less than forty percent. In any of the embodiments described herein, however, the angled silicide contacts are desirable for small scale node technology, e.g., 32 nm technology.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method of fabricating a semiconductor device, the method comprising:
   providing a substrate having a layer of semiconductor material;
   creating a gate structure overlying the layer of semiconductor material;
   forming recesses in the layer of semiconductor material adjacent to the gate structure; and
   at least partially filling the recesses with a filler semiconductor material, to form facet-shaped semiconductor regions in the recesses; wherein:
   at least partially filling the recesses comprises epitaxially growing the filler semiconductor material in the recesses under growth conditions that promote formation of the facet-shaped semiconductor regions;
   forming recesses in the layer of semiconductor material results in exposed recess surfaces that correspond to the {110} plane of the semiconductor material;
   epitaxially growing the filler semiconductor material is performed under growth conditions that promote a relatively high growth rate of the filler semiconductor material for its {111} planes, and a relatively low growth rate of the filler semiconductor material for its {110} plane; and
   the facet-shaped semiconductor regions comprise facet regions that point downward, relative to the substrate.

2. The method of claim 1, wherein epitaxially growing the filler semiconductor material is performed at a relatively low growth temperature.

3. The method of claim 2, wherein epitaxially growing the filler semiconductor material is performed at a growth temperature within the range of about 500-580 degrees Celsius.

4. The method of claim 1, wherein at least partially filling the recesses comprises epitaxially growing in situ doped semiconductor material in the recesses.

5. The method of claim 1, wherein at least partially filling the recesses comprises at least partially filling the recesses with a stress-inducing semiconductor material.

* * * * *